United States Patent [19]
Huang

[11] Patent Number: 6,037,628
[45] Date of Patent: Mar. 14, 2000

[54] SEMICONDUCTOR STRUCTURES WITH TRENCH CONTACTS

[75] Inventor: Qin Huang, Blacksburg, Va.

[73] Assignee: Intersil Corporation, Melbourne, Fla.

[21] Appl. No.: 08/885,922

[22] Filed: Jun. 30, 1997

[51] Int. Cl.[7] ............... H01L 29/76; H01L 29/94; H01L 31/062; H01L 31/113
[52] U.S. Cl. ............... 257/329; 257/330; 257/331; 257/377
[58] Field of Search .................. 257/377, 329, 257/330, 331, 332, 328

[56] References Cited

U.S. PATENT DOCUMENTS

| | | |
|---|---|---|
| 4,853,345 | 8/1989 | Himelick . |
| 5,366,914 | 11/1994 | Takahashi et al. . |
| 5,554,862 | 9/1996 | Omura et al. ............... 257/331 |
| 5,623,152 | 4/1997 | Majumdar et al. ............... 257/330 |
| 5,648,670 | 7/1997 | Blanchard ............... 257/329 |
| 5,689,128 | 11/1997 | Hshieh et al. ............... 257/329 |
| 5,719,409 | 2/1998 | Singh et al. ............... 257/328 |

FOREIGN PATENT DOCUMENTS

| | | |
|---|---|---|
| 0 747 967 | 12/1996 | European Pat. Off. . |
| 43 00 806 | 12/1993 | Germany . |

Primary Examiner—Steven H. Loke
Attorney, Agent, or Firm—Rogers & Killeen

[57] ABSTRACT

Semiconductor structures such as the trench and planar MOSFETs (UMOS), trench and planar IGBTs and trench MCTs using trenches to establish a conductor. Improved control of the parasitic transistor in the trench MOSFET is also achieved and cell size and pitch is reduced relative to conventional structures.

9 Claims, 5 Drawing Sheets

SEMICONDUCTOR STRUCTURES WITH TRENCH CONTACTS

This application is related to U.S. patent application Ser. No. 08/885,879 entitled "A NOVEL TRENCH MOSFET PROCESS" owned by the assignee hereof and filed concurrently herewith.

BACKGROUND OF THE INVENTION

The present invention relates to semiconductor devices such as MOSFETs using trenches to establish electrical contact.

The conventional trench process for forming MOSFETs uses a total of six masks; i.e., 1. a first mask for defining a buried layer region in a semiconductor;
2. a second mask for defining an active area;
3. a source mask for source implantation;
4. a trench mask for defining the trench of etching and filling;
5. a contact mask to define the areas of contacts; and
6. a metal mask.

This process results in a relatively deep junction, wider cell pitch, wider source width and a stronger parasitic transistor problem.

Accordingly, it is an object of the present invention to provide a novel semiconductor structure made by a process which uses fewer masks.

It is another object of the present invention to provide a novel trench contact structure where the buried layer may selectively be controlled and made deeper than the depth of the trench gate.

It is yet another object of the present invention to provide novel structures for both trench and planar devices.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The novel process of the present invention will be illustrated in connection with a P channel MOSFET, but it is to be understood that the process is equally applicable to N channel MOSFETs and to other semiconductor structures.

Figure 1:
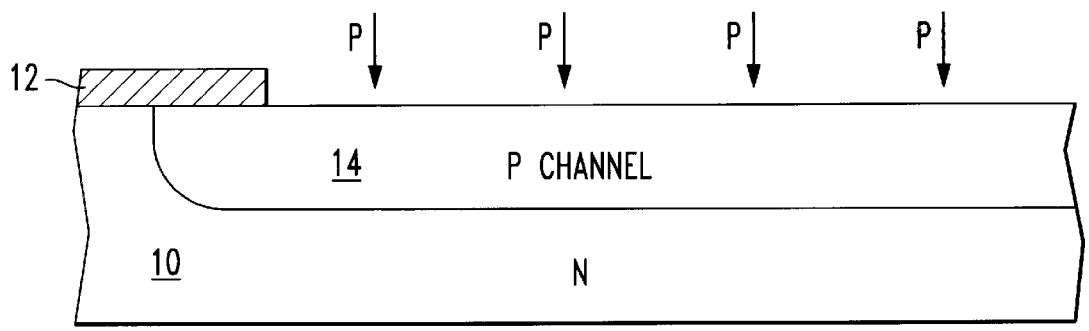
FIGS. 1–9 illustrate the sequence of steps in the novel process of the present invention.

With reference to FIG. 1, the surface of a N type semiconductor wafer 10 is masked by a conventional mask 12 to define an active region, and a P type impurity is implanted in a conventional manner and driven, e.g., by annealing, to form a P channel region 14. The region of P type impurity 14, generally referred to as th e base region, is herein referred to as the channel region because it is the region in which the channel forms during operation of the device.

Figure 2:
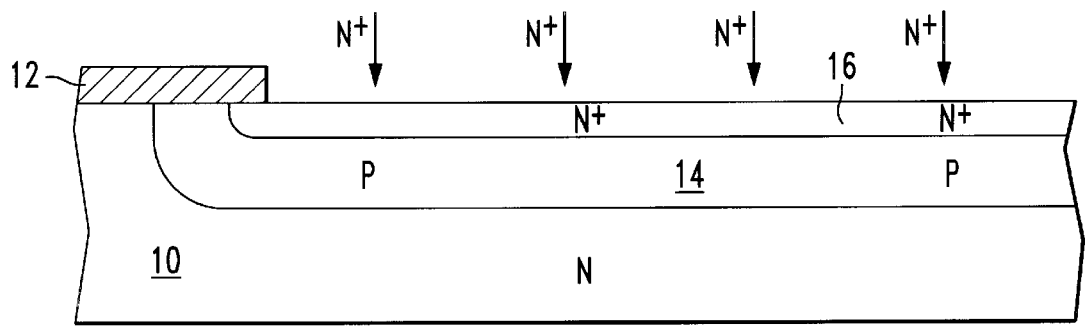

As shown in FIG. 2, a N type polarity impurity may then be implanted and driven into the channel area 14 to form a N+ source region 16 adjacent the surface of the wafer.

Figure 3:
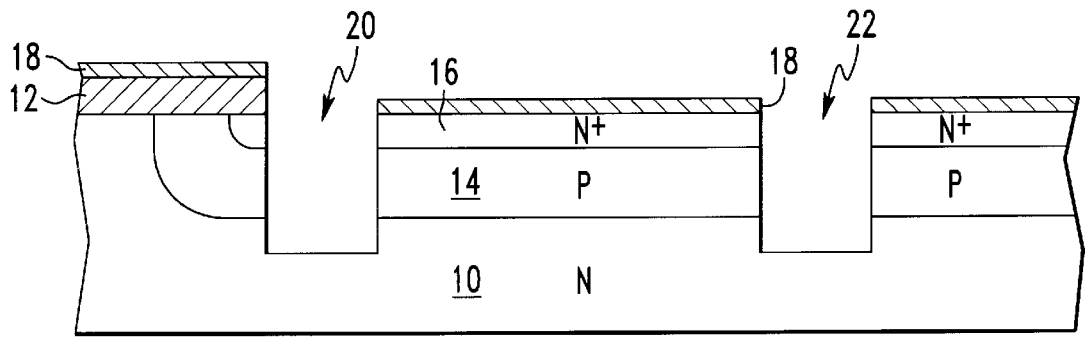

A second conventional mask 18 may then be used as shown in FIG. 3 to define the area for two trenches 20, 22. The trenches 20,22 may then be etched in a suitable conventional manner downwardly through the N+ source region 16 and the P channel region 14 into N wafer.

Figure 4:
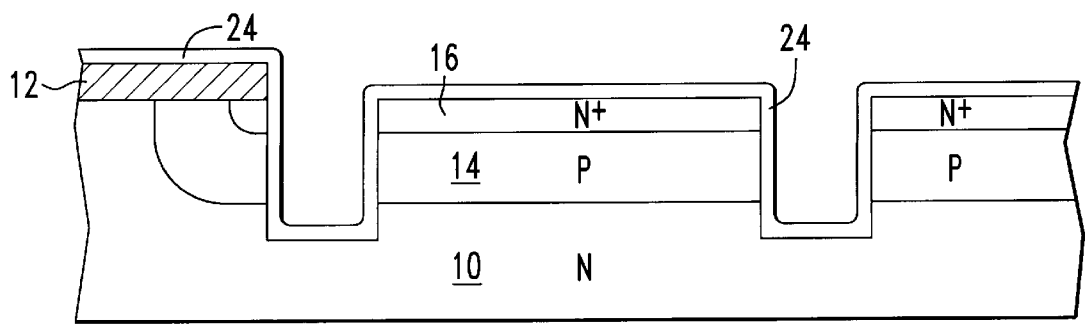

The second mask 18 of FIG. 3 may then be removed and a gate oxide layer 24 over all of the exposed upper surface of the semiconductor including the walls and bottom of the trenches 20,22 as shown in FIG. 4.

Figure 5:
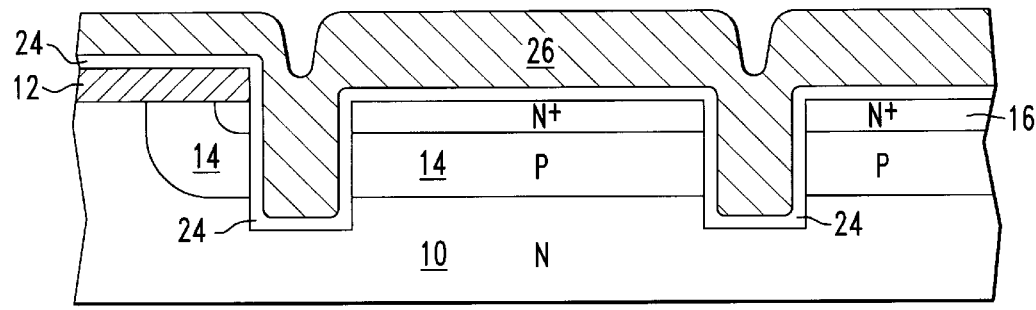

As shown in FIG. 5, a layer of polysilicon 26 may conventionally be provided over the gate oxide later 24, completely filling the trenches 20,22.

Figure 6:
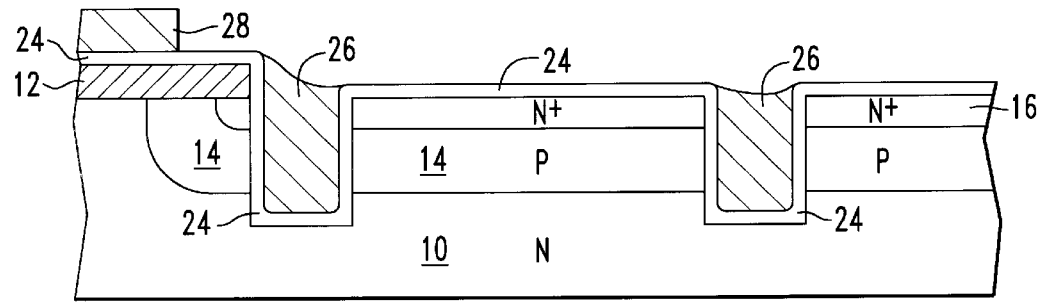

As shown in FIG. 6, a third mask 28 may then be provided to define an area larger than the active region defined by the mask 12 to protect the polysilicon layer 26 for establishing a contact at a later time. Thereafter, the polysilicon layer 26 left unprotected by the mask 28 may be etched back to leave polysilicon 26 only in the trenches 20,22.

Figure 7:
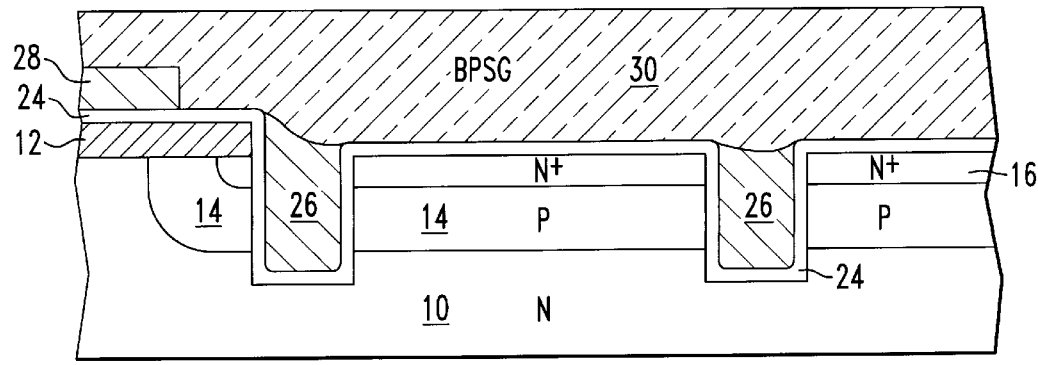
Figure 8:
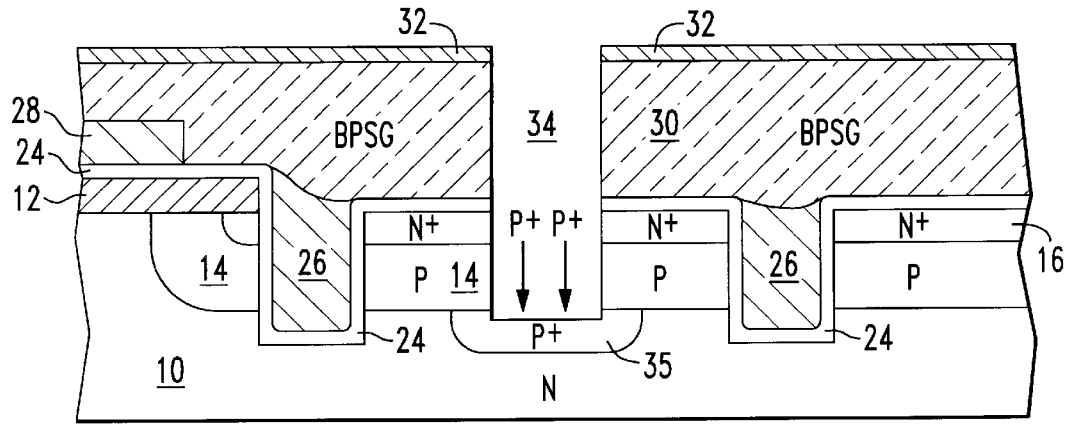

A layer of borophosphosilicate glass ("BPSG") 30 may then be formed over the surface of the semiconductor as shown in FIG. 7, and, as shown in FIG. 8, a fourth mask 32 may be conventionally formed over the BPSG layer 30 to thereby define a the area for a third trench 34 which may be etched through the BPSG layer 30, the gate oxide 24, the N+ source 16, and the P channel area 14 into the N semiconductor 10. Once the trench 34 has been etched, a P type impurity may be implanted and driven into the N wafer to thereby form a P+ area 35 of higher impurity concentration than the P channel region 14.

Figure 9:
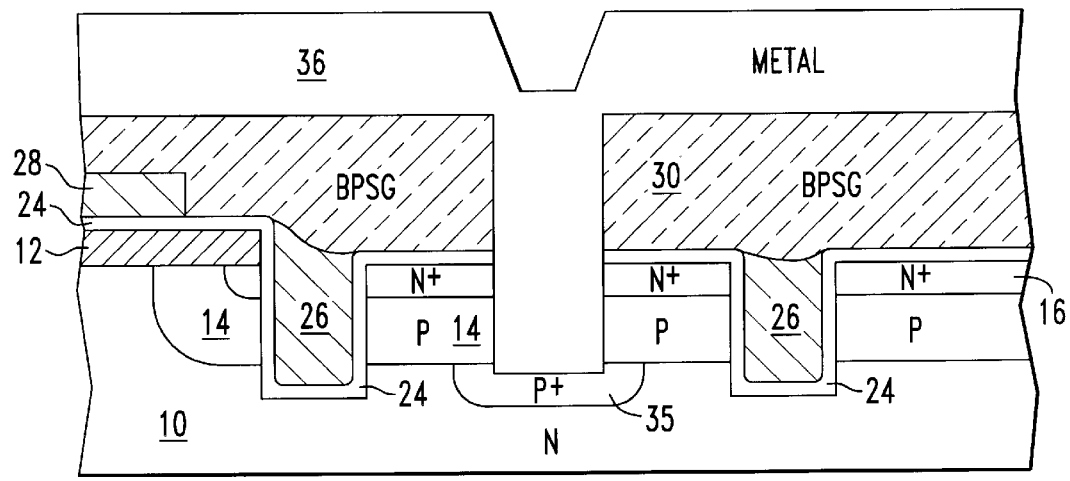

As illustrated in FIG. 9, a metal layer 36 may then be formed over both the BPSG area 30 to thereby establish a contact with the N+ source region and the P+ high concentration region 35 at the bottom of the trench 34 of FIG. 8.

The four mask trench process of the present invention eliminates two masks used in the prior art process, i.e., the P+ mask and the source block mask, and it makes alignment easier to achieve, i.e., the only alignment required is the contact to the trench.

Figure 10:
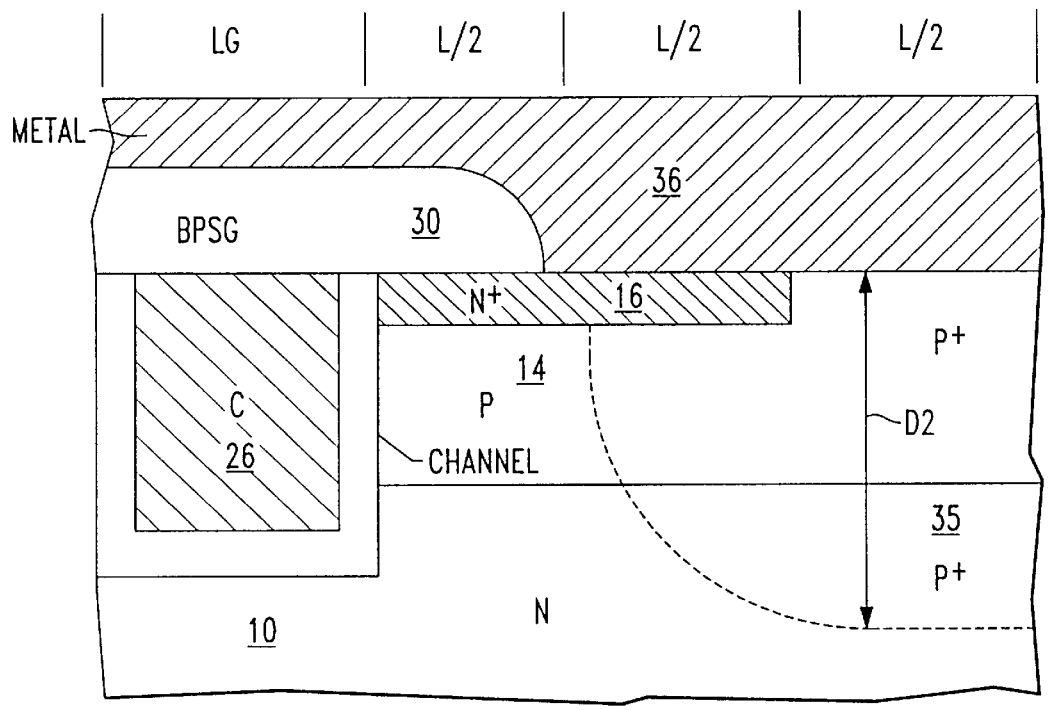
FIG. 10 illustrates the structure which results from the conventional trench process.

The six mask process of the prior art process results in a structure as shown in FIG. 10 and provides a ready contrast with the structure of the present trench process.

In the prior art structure of FIG. 10, the cell pitch is equal to the length of the gate ("LG") plus three time the length of the design rule value ("L") and the width of the source is equal to L.

Figure 11:
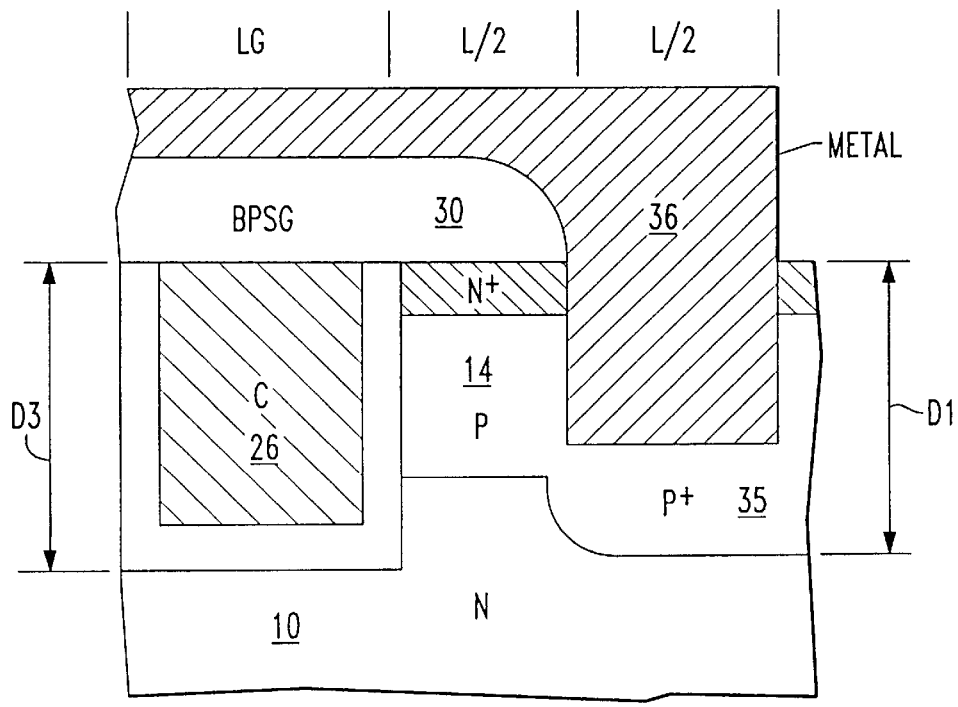
FIG. 11 illustrates the novel structure which results from the trench process of the present invention.
Figure 12:
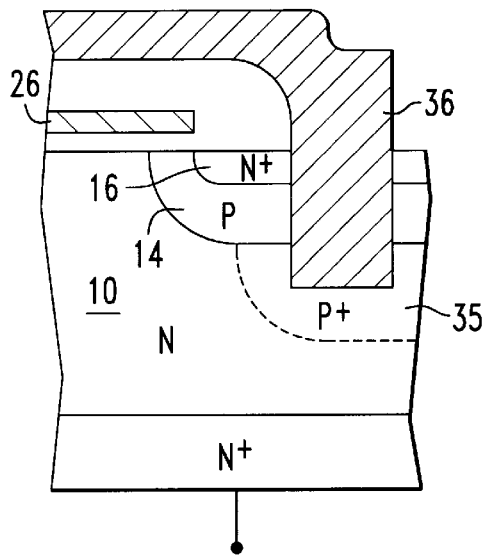
FIG. 12 illustrates the novel structure of the present invention embodied in a planar MOSFET.
Figure 13:
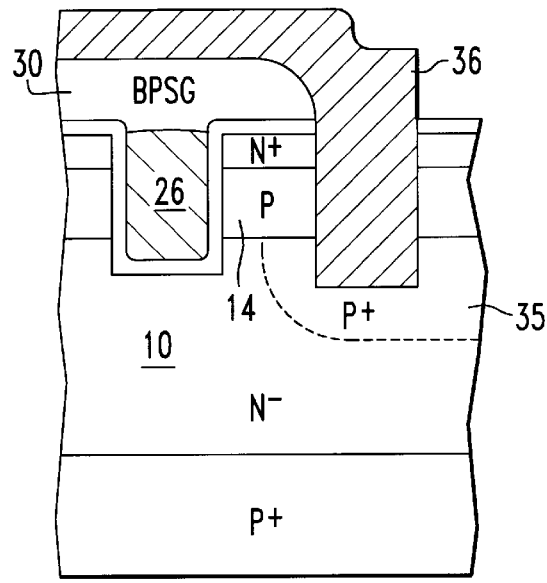
FIG. 13 illustrates the novel structure of the present invention embodied in a trench insulated gate bipolar transistor ("IGBT").
Figure 14:
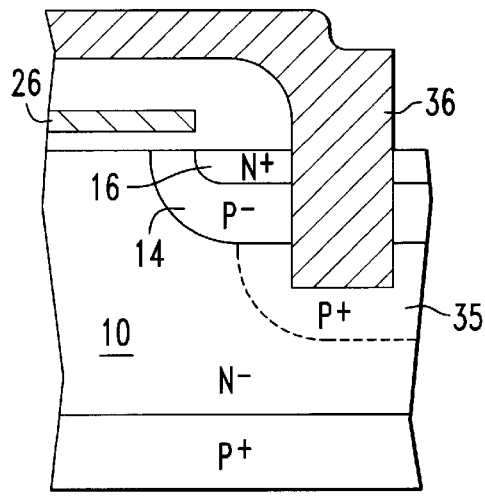
FIG. 14 illustrates the novel structure of the present invention embodied in a planar IGBT.

In contrast, the structure of FIG. 11 provides a cell pitch of LG plus 2L, a saving of L and the width of the source is reduced to L/2. In addition, the depth D1 of the P+ high concentration area or buried layer 35 may be significantly reduced below the depth D2 in FIG. 10 because the depth D2 is necessitated to achieve the lateral diffusion of the P+ implant under the source 16. Because of the impact of the lateral diffusion on the channel 14, the length of the source, and thus the design rule value L, negatively impacts on the pitch of the device. Because the length of the source 16 is reduced in FIG. 11, it is possible to reduce the design rule value L and the pitch.

Additionally, the depth D1 of the buried layer 35 in FIG. 11 may be greater than the depth D3 of the trench gates 20,22, making it possible for the MOSFET to break down at the PN junction 35 and protect the trench gate 26.

Figure 15:
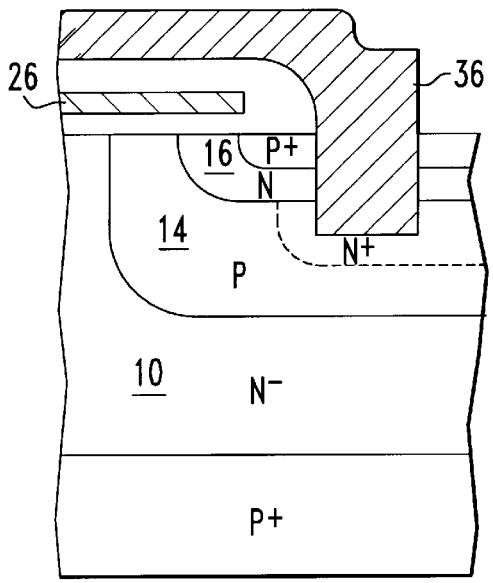
FIG. 15 illustrates the novel structure of the present invention embodied in a planar MCT.

With reference to FIGS. 12–15 in which like numerical references have been retained with the structures of FIGS. 10 and 11 to facilitate a comparison therewith, the present invention may be embodied in a planar MOSFET (FIG. 12), a trench IGBT (FIG. 13), a planar IGBT (FIG. 14) and a planar MCT (FIG. 15).

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A semiconductor device comprising:
   a wafer having at least one horizontal PN junction;
   a pair of spaced trenches of a first electrically conducting material surrounded by insulation; and
   a third trench filled completely with only a second conducting material intermediate said spaced trenches and extending deeper into said wafer than said spaced trenches, said third trench extending downwardly through said at least one horizontal PN junction without reaching a second PN junction vertically displaced from said at least one horizontal PN junction.

2. The device of claim 1 wherein each of said spaced trenches comprise polysilicon surrounded by an oxide.

3. The device of claim 1 wherein said third trench is filled with a metal.

4. The device of claim 1 further comprising borophosphosilicate glass insulating the conducting material in each of said trenches from each other.

5. A FET semiconductor structure comprising:
   a polysilicon filled trench lined with a gate oxide bounding a source region, said source region overlying and in contact with a channel region, said channel region overlying and bordering a region of high concentration so that there is a material area of contact between said channel region and said region of high concentration; and
   a metal contact with both the source and channel regions, wherein the metal extends downwardly a distance greater than the depth of the trench into contact with the channel region rather than laterally along the wafer surface into contact with the channel region so that the only substantial contact of the metal with the channel region is on a vertical surface.

6. A FET semiconductor device formed in a silicon wafer comprising:
   a region of high concentration;
   a channel region overlying and bordering said region of high concentration;
   a source region overlying and in contact with said channel region;
   a gate oxide lined first trench filled with polysilicon bounding said source region and said channel region;
   a metal filled second trench is in direct contact with said source region, said channel region, and said region of high concentration and extending deeper into said wafer than said first trench.

7. The device of claim 6 further comprising borophosphosilicate glass insulating said polysilicon from said metal.

8. A FET semiconductor device formed in a silicon wafer comprising:
   a region of high concentration;
   a channel region overlying and bordering said region of high concentration;
   a source region overlying and in contact with said channel region;
   a gate oxide lined first trench filled with polysilicon bounding said source region and said channel region;
   a metal filled second trench bounding said source region, said channel region, and said region of high concentration and extending deeper into said wafer than said first trench, said metal extending out from said second trench and overlying said first trench.

9. The device of claim 8 further comprising borophosphosilicate glass disposed over said first trench and between said metal and said first trench.

* * * * *